United States Patent
Feng et al.

(10) Patent No.: US 8,008,131 B2
(45) Date of Patent: Aug. 30, 2011

(54) SEMICONDUCTOR CHIP PACKAGE ASSEMBLY METHOD AND APPARATUS FOR COUNTERING LEADFINGER DEFORMATION

(75) Inventors: Chien-Te Feng, Shindian (TW); Kevin Jin, Hsin Tien (TW)

(73) Assignee: Texas Instruments Incorporated, Dallas, TX (US)

( * ) Notice: Subject to any disclaimer, the term of this patent is extended or adjusted under 35 U.S.C. 154(b) by 760 days.

(21) Appl. No.: 12/055,735

(22) Filed: Mar. 26, 2008

(65) Prior Publication Data

US 2009/0243057 A1    Oct. 1, 2009

(51) Int. Cl.
  H01L 21/50   (2006.01)
  H01L 21/48   (2006.01)
  H01L 21/44   (2006.01)
  H01L 23/495  (2006.01)
  H01L 23/10   (2006.01)
  H01L 23/367  (2006.01)

(52) U.S. Cl. ........ 438/122; 438/121; 438/123; 257/670; 257/675; 257/707; 257/E23.104

(58) Field of Classification Search .......... 438/121–123; 257/670, 675, 707, E23.104
See application file for complete search history.

(56) References Cited

U.S. PATENT DOCUMENTS

| | | | |
|---|---|---|---|
| 5,666,003 A * | 9/1997 | Shibata et al. | 257/796 |
| 6,404,048 B2 * | 6/2002 | Akram | 257/706 |
| 6,924,549 B2 * | 8/2005 | Nose et al. | 257/676 |
| 2003/0183907 A1 * | 10/2003 | Hayashi et al. | 257/666 |
| 2005/0218194 A1 | 10/2005 | Suzuki | |

FOREIGN PATENT DOCUMENTS

| JP | 2000150582 A | 5/2000 |
|---|---|---|
| KR | 20000014537 U | 7/2000 |

* cited by examiner

*Primary Examiner* — Luan C Thai
(74) *Attorney, Agent, or Firm* — Yingsheng Tung; Wade J. Brady, III; Frederick J. Telecky, Jr.

(57) ABSTRACT

The invention provides semiconductor chip packages, tools, and methods for preventing and for correcting leadfinger deformation caused during wirebonding in semiconductor chip package manufacturing. Disclosed are improved heat blocks and methods for their use in ensuring adequate clearance between leadfingers and adjacent heat spreaders, as well as semiconductor chip package assemblies wherein a selected clearance between leadfingers and parallel surfaces may be assured. Methods of the invention include steps for supporting the proximal ends of the leadfingers using the wirebonding cavity of a heat block. Thus supported, a plurality of bondwires are attached to couple bond pads of the semiconductor chip to the proximal ends of leadfingers. Thereafter, the clearance between the wirebonded proximal ends of the leadfingers and the adjacent parallel surface of the heat spreader is adjusted using a spacing cavity of the heat block. In preferred embodiments of the invention, a plurality of bondwires couple a plurality of bond pads of the semiconductor chip to the proximal end of a single leadfinger, with assured clearance between the proximal end of the leadfinger and an underlying surface.

15 Claims, 6 Drawing Sheets

SEMICONDUCTOR CHIP PACKAGE ASSEMBLY METHOD AND APPARATUS FOR COUNTERING LEADFINGER DEFORMATION

TECHNICAL FIELD

The invention relates to electronic semiconductor chip package assemblies and manufacturing. More particularly, the invention relates to manufacturing tools and methods for preventing and for correcting leadfinger deformation caused during wirebonding in semiconductor chip package manufacturing.

BACKGROUND OF THE INVENTION

In leaded semiconductor chip packages, a chip is generally affixed to a leadframe using a permanent adhesive. In some cases, it is desirable to enhance the thermal performance of a package by improving the path for the departure of heat from the chip to an outside surface of the package. In many such cases, it is known to incorporate a heat spreader into the leadframe structure, for example, by welding, taping, or gluing the heat spreader to the chip-mount portion of the leadframe. In other cases, a heat spreader is riveted in place on the leadframe, and a chip is mounted directly to the heat spreader surface. In either case, due to its heat conduction properties, the heat spreader is typically made from metal, such as copper or copper alloy. In some instances, in order to increase its heat conduction, the heat spreader is large relative to the chip, extending in a plane parallel with the proximal ends of the leadfingers. This type of arrangement of chip, leadfingers, and heat spreader at least partially underlying the leadfingers, is used in many applications, but is not without its problems.

Electrical connections within a semiconductor chip package are commonly made by bonding wires from bond pads on the surface of the chip to the proximal ends of the leadfingers. The leadfingers typically extend from one end adjacent to a gap in the leadframe proximal to the chip, to a distal end at the exterior of the package where electrical connections may be made to the outside world. During a typical wirebonding process, a ball bond is formed on a bond pad of the chip using heat, pressure, and in many cases ultrasonic vibrations. The wire is then pulled to the proximal end of a leadfinger, and a stitch bond is formed there, also using some combination of heat and pressure, and often ultrasonic vibrations.

Wirebonding equipment generally includes a heat block, made of rigid material, for providing heat and supporting the leadframe during wirebonding. Pursuant to a wirebonding process, the heat block is heated to a predetermined temperature. A leadframe assembly including a leadframe, chip, and heat spreader, is placed in a cavity provided in the heat block and is typically secured in place by an associated clamp. Wirebonds are then made from the chip to the leadfingers and the assembly is thereafter removed from the heat block for further processing, such as encapsulation and ultimate separation. In many applications, supporting the proximal ends of the leadfingers during wirebonding is simply a matter of placing the leadframe assembly into a supporting cavity of a heat block.

The present invention is directed to overcoming, or at least reducing, problems present in the prior art, and contributes one or more heretofore unforeseen advantages, indicated herein, for providing improved heat blocks, and related methods for their use in the manufacture of improved semiconductor chip package assemblies.

SUMMARY OF THE INVENTION

In carrying out the principles of the present invention, in accordance with preferred embodiments thereof, the invention provides novel and useful improvements for manufacturing leadframes used in semiconductor chip package assemblies, and related apparatus. In some semiconductor chip packages, the proximal ends of the leadfingers are suspended parallel to the surface of a heat spreader. When placed in an ordinary heat block cavity for wirebonding, such a leadframe assembly is supported at the heat spreader, but the proximal ends of the leadfingers, which are suspended parallel to the heat spreader, lack lateral support. During wirebonding, the suspended proximal ends of the leadfingers are deflected "downward", e.g., in the direction opposite the wirebond, by the application of pressure from the bonding tool. In some cases, the deflected leadfingers come into contact with the underlying heat spreader during wirebonding. Due to the mechanical properties of the leadframe material, however, which is typically made from metal such as aluminum, copper, or alloy, the leadframe has some capacity to spring back toward its original shape after the pressure of the bonding tool is removed. Thus, in many cases, the deflection problem may be relatively minor, or may even go unnoticed. In other cases, the return of the proximal ends of the leadfingers toward their original positions is sometimes incomplete however, thus it is known in the art to provide additional clearance between the leadfingers and underlying heat spreader such that sufficient distance is nevertheless maintained in the event the leadfingers do not completely spring back to their original positions. Providing increased clearance between leadfingers and heat spreaders can result in thicker package assemblies, which in most applications is undesirable. Minimizing thickness by reducing such clearance can result in electrical problems and defective package assemblies. From an electrical performance standpoint, it is desirable to keep bondwires short. From a cost standpoint, shorter wires, which are typically made from precious metals, result in lower materials costs. Thus, the problem does not lend itself to solution by the simple expedient of shortening the proximal ends of the leadfingers in order to reduce their susceptibility to deformation by deflection, since longer bondwires are then required.

Experience, observation, analysis, and careful study of assembly processes and defects related to clearance issues have led the Applicants to determine that in some instances, particularly those applications wherein multiple wirebonds are formed from a chip to a single leadfinger suspended over a heat spreader, clearance problems may be more frequently encountered. It has been observed that in such cases, the effects of repeated deflection of such a leadfinger may be cumulative, with the result that the proximal end of the multi-wirebond leadfinger becomes permanently deformed by the wirebonding process. When the geometry of the package includes a heat spreader extending in a plane parallel to the proximal ends of the multi-bonded leadfingers, the proximal ends of the multi-bonded leadfingers can in some cases be left in contact with, or nearly in contact with, the heat spreader due to deformation caused by the pressures applied to the leadfingers during wirebonding. In such cases, undesirable interference, capacitance, or even short circuits may result. The applicants have developed tools and techniques for alleviating leadfinger deformation during package assembly. In general, the present invention provides improved heat blocks and methods for their use in ensuring adequate clearance between leadfingers and underlying heat spreaders in semiconductor chip package assemblies. The invention also provides package assemblies wherein a selected clearance between leadfingers and heat spreaders may be assured.

According to one aspect of the invention, a preferred embodiment of a method for assembling a semiconductor chip package includes steps for providing a metallic leadframe assembly having a leadframe, an attached heat spreader, and an attached semiconductor chip. Leadfingers of the leadframe each have a proximal end for receiving one or more bondwire. The proximal ends of the leadfingers define a plane parallel to a surface of the heat spreader. A wirebonding cavity of a heat block is used to support the proximal ends of the leadfingers, while bondwires are attached coupling bond pads on the chip to proximal ends of leadfingers. Subsequently, a spacing cavity of the heat block is used for adjusting the clearance between the wirebonded proximal ends of the leadfingers and the surface of the heat spreader.

According to another aspect of the invention, a preferred method of the invention includes steps for supporting the proximal ends of the leadfingers using a wirebonding cavity of a heat block, while attaching multiple bondwires coupling bond pads of the chip to the proximal end of a single leadfinger.

According to still another aspect of the invention, a heat block for use in assembling a semiconductor chip package includes a rigid body with one or more wirebonding cavity adapted for supporting a leadframe assembly during wirebonding. The wirebonding cavity is configured for holding the surface of a heat spreader included in the leadframe assembly against the proximal ends of leadfingers of the leadframe assembly for their support during wirebonding. The heat block also includes a spacing cavity adapted for use after wirebonding in order to adjust the clearance between the wirebonded proximal ends of the leadfingers and the surface of the heat spreader.

According to yet another aspect of the invention, a semiconductor chip package embodiment includes a leadframe assembly with a metal leadframe and an attached heat spreader. Leadfingers of the leadframe each have a proximal end; the proximal ends of the leadfingers define a plane parallel to a surface of the heat spreader. A semiconductor chip attached to the leadframe has bond pads coupled by bondwires to the proximal ends of leadfingers, at least one leadfinger being coupled to a number of bond pads with a number of bondwires. The clearance between the wirebonded proximal ends of the leadfingers and the surface of the heat spreader are all approximately equal.

The invention has advantages including but not limited to one or more of the following: decreased thickness in package structures; increased yield and reliability in manufacturing processes; improved thermal performance in packages; and reduced cost. These and other features, advantages, and benefits of the present invention can be understood by one of ordinary skill in the arts upon careful consideration of the detailed description of representative embodiments of the invention in connection with the accompanying drawings.

BRIEF DESCRIPTION OF THE DRAWINGS

The present invention will be more clearly understood from consideration of the following detailed description and drawings in which.

The drawings are not to scale, and some features of embodiments shown and discussed are simplified or amplified for illustrating principles and features, as well as anticipated and unanticipated advantages of the invention.

DESCRIPTION OF PREFERRED EMBODIMENTS

While the making and using of various exemplary embodiments of the invention are discussed herein, it should be appreciated that the present invention provides inventive concepts which can be embodied in a wide variety of specific contexts. It should be understood that the invention may be practiced with semiconductor package assemblies and associated manufacturing processes of various types and materials without altering the principles of the invention. For purposes of clarity, detailed descriptions of functions and systems familiar to those skilled in the semiconductor chip, packaging, and manufacturing arts are not included.

In general, the invention provides heat blocks for improved wirebonding, and methods for their use, particularly in applications wherein leadfinger deflection during wirebonding may be a potential concern. Features of the invention are advantageous in terms of reduced defects in completed package assemblies, improved thermal performance, decreased assembly thickness, improved electrical performance, and reduced cost.

Figure 1:
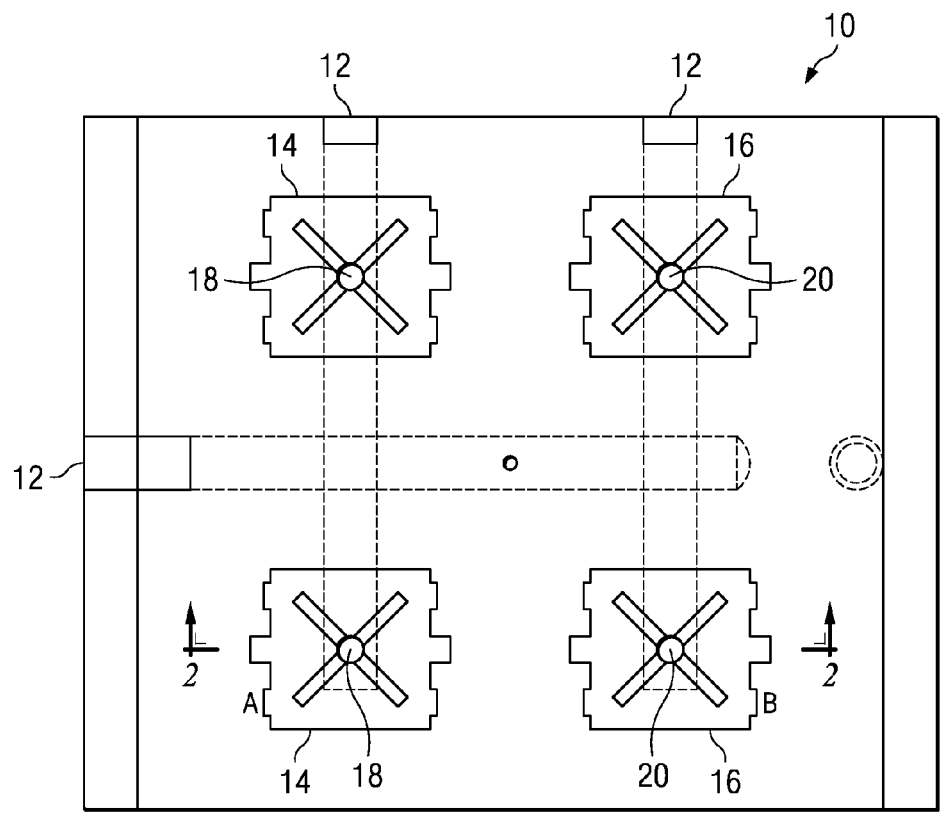
FIG. 1 is a top view of an example of a preferred embodiment of a heat block for use in the assembly of semiconductor chip packages according to the invention.
Figure 2:
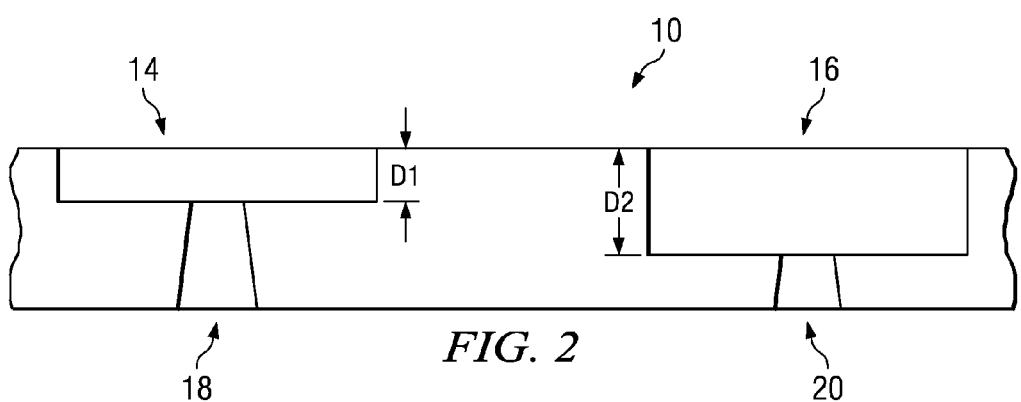
FIG. 2 is a cutaway side view of the preferred embodiment of a heat block introduced in FIG. 1.

Referring initially to FIG. 1, a top view of an example of a heat block 10 of the invention for use in the assembly of a semiconductor chip package is illustrated. The heat block 10 is preferably made from metal or other rigid heat conductive material. The heat block 10 is configured for receiving a leadframe assembly (not shown) in order to provide physical support to the surface of the leadframe assembly and to facilitate the transfer of heat to the leadframe assembly during wirebonding. The heat block preferably has machined receiving passages 12 adapted for receiving heaters and/or thermocouples for maintaining selected heating levels. Cavities 14, 16, are configured for receiving chip-mounting portions of the leadframe assembly, e.g., chip paddles or heat spreaders. Now also referring to FIG. 2, a cutaway side view of the heat block 10, taken along line 2 of FIG. 1, shows that the cavities 14, 16, are of unequal depths. A wirebonding cavity 14 is preferably provided with a relatively shallow depth D1, and a spacing cavity 16 is preferably provided with a relatively deeper depth D2. Preferably, vacuum ports 18, 20 may be provided to the wirebonding cavity 14 and spacing cavity 16 respectively. The vacuum ports 18, 20, if used, are in communication with one or more associated vacuum sources (not shown) in order to facilitate the application of vacuum forces in the cavities 14, 16 during the assembly process.

Figure 3A:
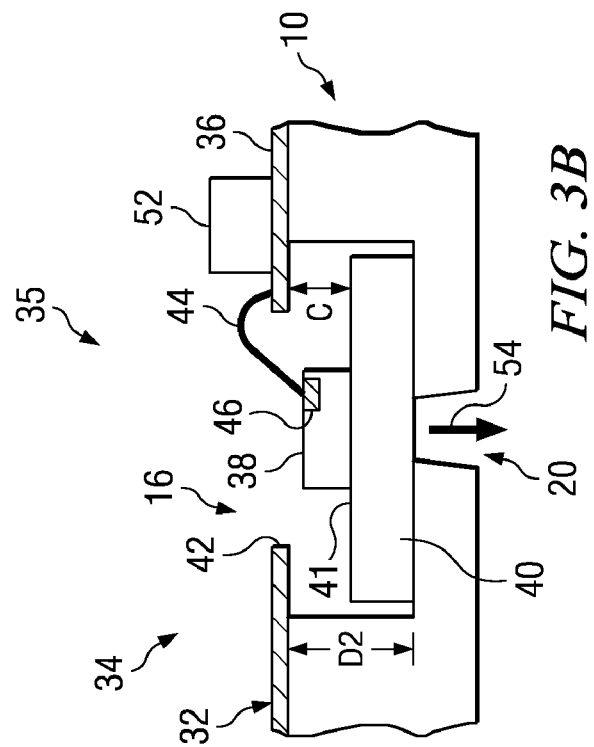
FIG. 3A is a cutaway partial side view of a semiconductor package assembly and heat block in an example of a preferred embodiment of the invention.
Figure 3B:
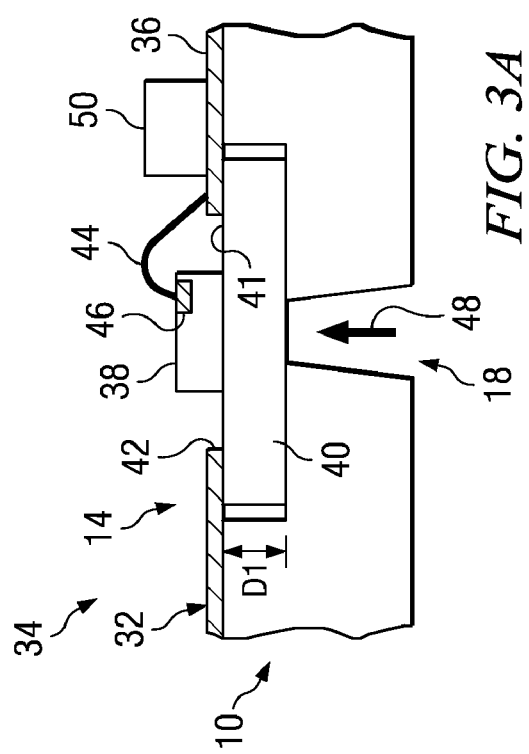
FIG. 3B is a cutaway partial side view of a semiconductor package assembly and heat block in an example of a preferred embodiment of the invention.

Now referring primarily to FIGS. 3A and 3B, cutaway partial side views depict an exemplary embodiment of a heat block 10 supporting a leadframe assembly 34 in the performance of steps in a preferred method of the invention. A leadframe 32 provides a structural skeleton for the leadframe assembly 34, and ultimately the package. The leadframe 32 has leadfingers 36 proximal to a chip 38 and extending outward for potential electrical connection elsewhere. A heat spreader 40 preferably has a surface 41 suitable for receiving the permanent mounting of the chip 38, and extends in a plane parallel to a plane defined by the proximal ends 42 of the leadfingers 36. Alternatively, in some cases, depending on leadframe assembly design, a portion of the leadframe, e.g., a chip paddle or die pad (not shown in the preferred embodiment of FIGS. 3A and 3B), may be interposed between the chip and heat spreader. In any case, as shown in FIGS. 3A and 3B, the proximal ends 42 of the leadfingers 36 overhang a portion of the surface 41 of the heat spreader 40. In FIG. 3A, the heat block 10 is shown using a wirebonding cavity 14 for supporting the leadframe assembly 34 for wirebonding. The wirebonding cavity 14 is configured so that the heat spreader 40 may be brought to bear on the proximal ends 42 of the leadfingers 36, providing support to the proximal ends 42 of the leadfingers 36 during the application of force during the attachment of a bondwire 44. Preferably, the wirebonding process includes steps for first attaching a bondwire 44 to a bond pad 46 on the chip 38 and subsequently forming a bond on the proximal end 42 of the leadfinger 36. Preferably, the depth D1 of the wirebonding cavity 14 is selected in order to position and hold the heat spreader 40 and proximal ends 42 of the leadfinger 36 in contact during wirebonding. In some cases, multiple wirebonds may be formed from a number of bond pads, e.g., 46, to the same proximal end 42 of a leadfinger 36. As shown at arrow 48, a force, such as a vacuum or spring force for example, may be exerted to in order to ensure firm contact between the proximal ends 42 of the leadfingers 36 and the heat spreader 40. A clamp 50 preferably holds the leadframe assembly 34 firmly in place in the heat block 10 during wirebonding. The spring or vacuum force may be externally generated. Alternatively, the leadframe may be configured to lend itself to providing a spring force in the desired direction during processing.

As depicted in FIG. 3B, subsequent to wirebonding, the wirebonded leadframe assembly 35 is preferably moved from the wirebonding cavity 14 of the heat block 10 to the spacing cavity 16. The spacing cavity 16 is configured for ensuring that the correct spacing is maintained or restored to a wirebonded leadframe assembly 35. The spacing cavity 16 is relatively deep D2 compared to the wirebonding cavity 14 depth D1 (FIG. 3A). The wirebonded leadframe assembly 35 is clamped in place on the heat block 10 using an external clamp 52, and a force, indicated by arrow 54, such as a vacuum or spring force, is preferably exerted to pull the heat spreader 40 away from the proximal ends 42 of the leadfingers 36. Thus, the clearance C between the heat spreader 40 surface 41 and proximal ends 42 of the lead fingers 36 may be permanently adjusted or readjusted after wirebonding is complete. In particular, clearance C may be adjusted by bending the leadfingers, or by bending other portions of the leadframe, or heat spreader.

Figure 4A:
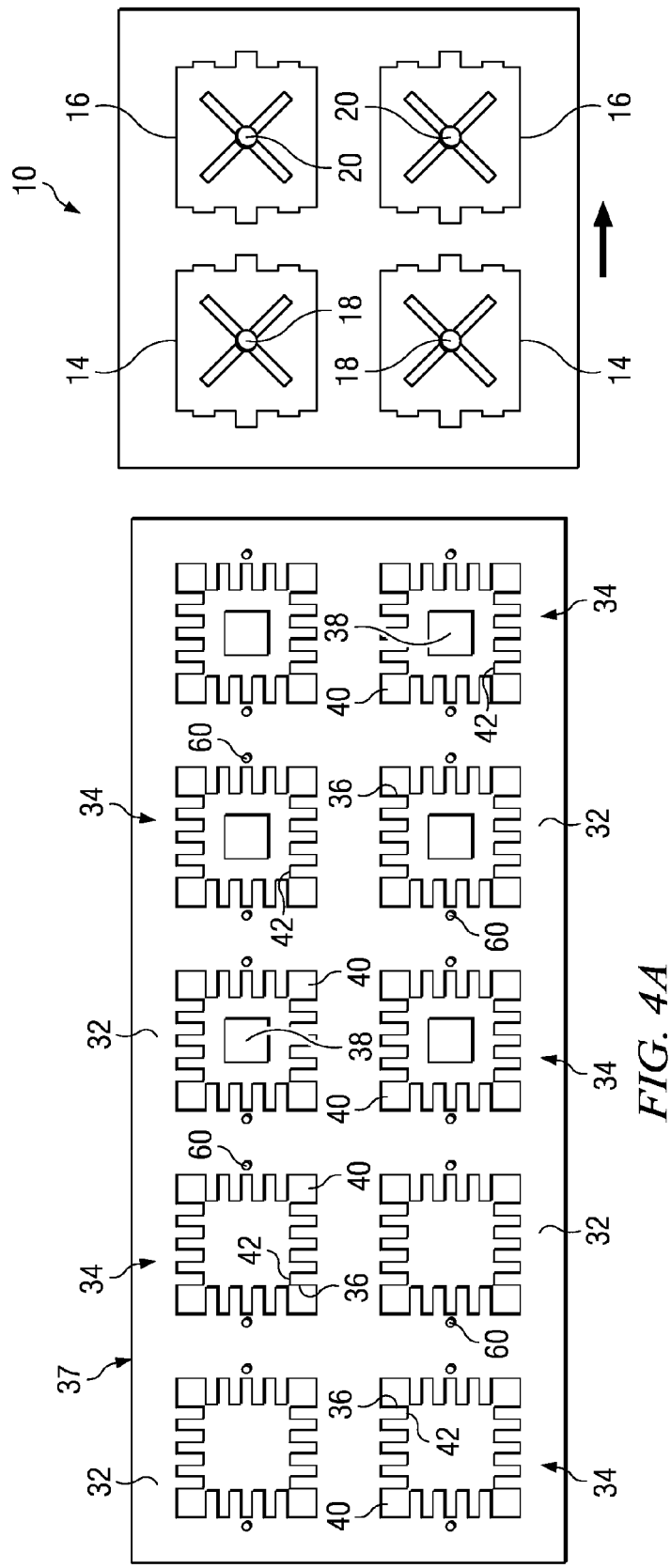
FIG. 4A is a top view of a semiconductor package assembly and heat block in an example of steps in a preferred embodiment of a method of the invention.
Figure 4B:
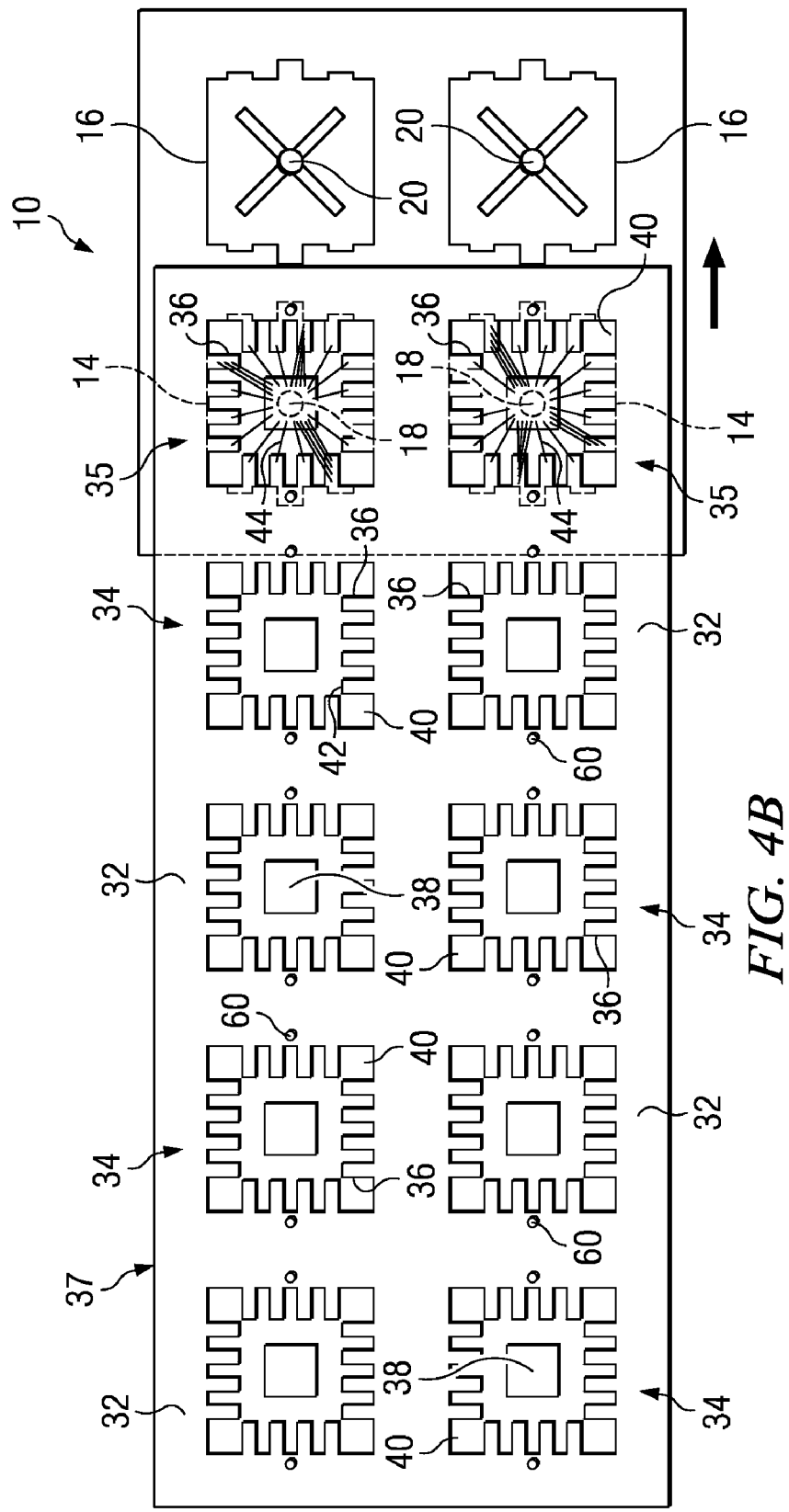
FIG. 4B is a top view of a semiconductor package assembly and heat block in an example of steps in a preferred embodiment of a method of the invention.
Figure 4C:
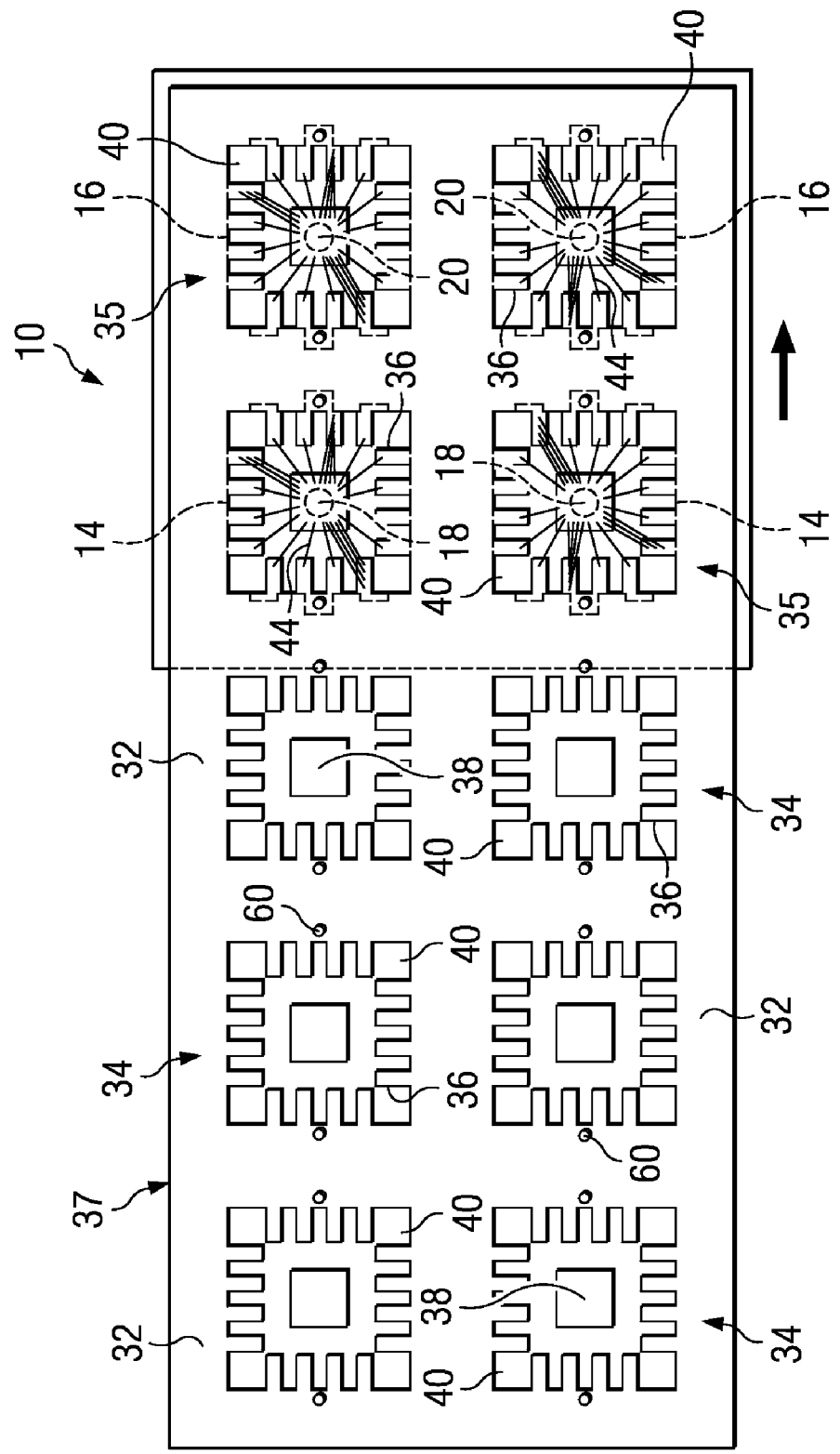
FIG. 4C is a top view of a semiconductor package assembly and heat block in an example of steps in a preferred embodiment of a method of the invention.

Referring to the series of FIGS. 4A through 4C, conceptual views of an example of the progression of a preferred method of the invention is illustrated. In FIG. 4A, a heat block 10 is shown with a leadframe assembly array 37 prepared for further package manufacturing steps. The leadframe assembly array 37 typically has a number of individual leadframes 32 arranged in an array suitable for manufacturing a number of completed semiconductor chip packages. In this particular example, the individual leadframes 32 are arranged in rows for processing in tandem. The leadframes 32 have heat spreaders 40, either affixed to the leadframes 32 with rivets 60 as shown, or affixed to a chip paddle using adhesive or other permanent attachment known in the arts. A chip 38 is affixed to the heat spreader 40, or to the intervening chip paddle (not shown). The chip 38 may also be attached after the leadframe 32 is placed in the heat block 10, so long as it is attached prior to wirebonding. The heat block 10 includes wirebonding cavities 14 for accepting leadframe assemblies 34 of the array 37, including leadframes 32, heat spreaders 40, and attached chips 38. It is characteristic of the invention that the leadframe assemblies 34 have leadfingers 36 with their proximal ends 42 suspended over heat spreaders 40.

As illustrated in FIG. 4B, the leadframe assemblies 34 are preferably positioned in the wirebonding cavities 14 in order to support the proximal ends 42 of the leadfingers 36 as bondwires 44 are attached using standard wirebonding tools known in the arts. Preferably, this is accomplished using the preselected depth D1 of the wirebonding chamber, and may in some cases be assisted by the application of an upward force, e.g., a vacuum force provided at a vacuum port 18 by an associated vacuum pump (not shown), or spring force provided by the configuration of the leadframe 32 itself, ensuring that the heat spreader 40 makes firm contact supporting the overhanging proximal ends 42 of the leadfingers during the time that downward pressure is exerted on the proximal ends 42 during the attachment of the bondwires 44. Preferably, a plurality of the individual leadfingers 36 have multiple bondwires 44 attached.

Subsequently, as shown in FIG. 4C, the wirebonded leadframe assemblies 35 are advanced to the spacing cavities 16, a downward force is preferably applied, e.g., a vacuum force applied at port 20, or spring force, in order to establish, or reestablish, advantageous clearance between the proximal ends 42 of the leadfingers 36 and the underlying surface 41 of the heat spreader 40. Preferably, one or more clamps placed on top of the leadframe array 37 firmly hold the leadframe 32 to the heat block 10. The clamps are omitted from these simplified views. Subsequent to wirebonding and spacing adjustment, the leadframe array 37 is typically placed in a block mold for encapsulation and ultimate singulation.

Figure 5:
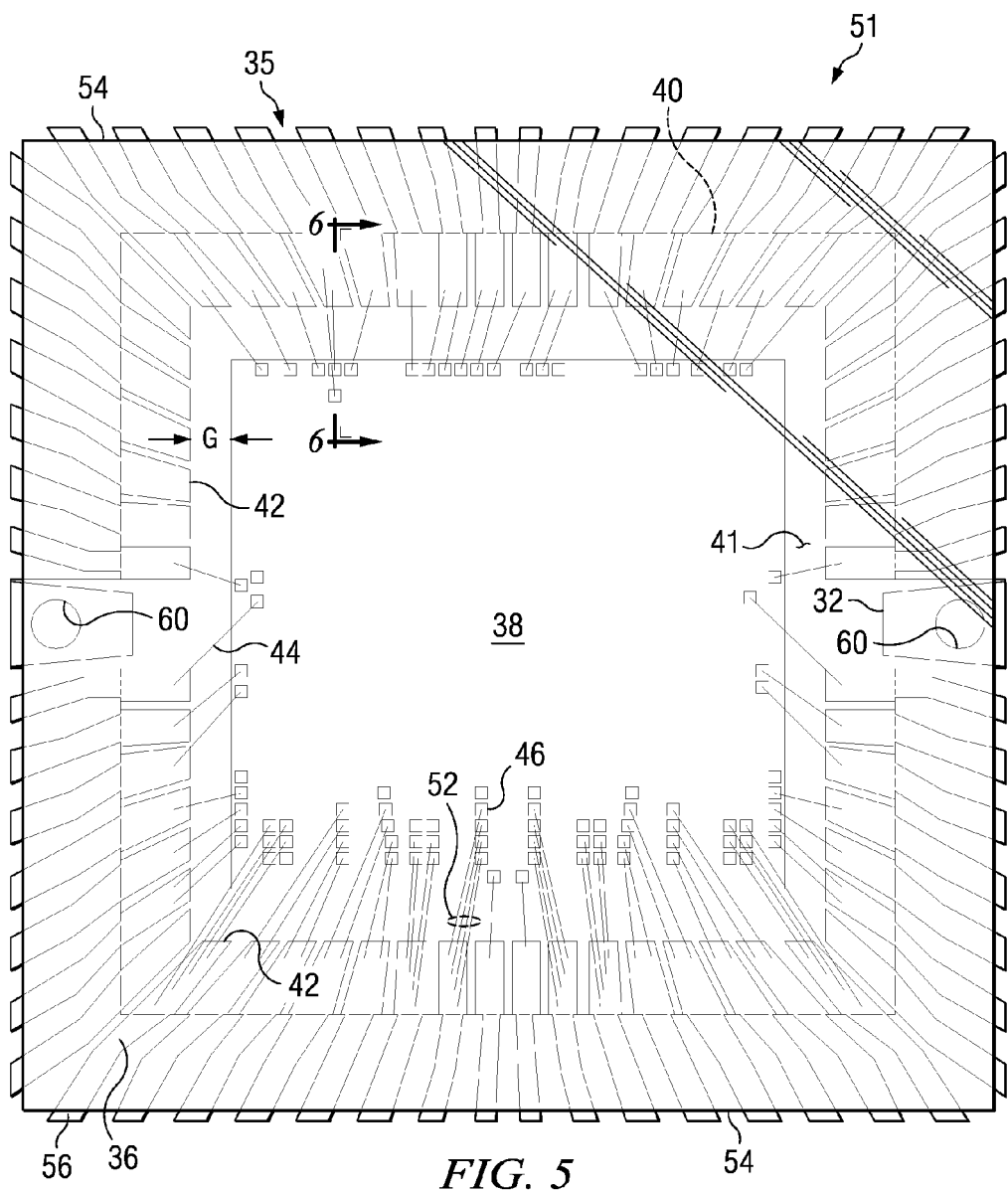
FIG. 5 is a top view of an example of a preferred embodiment of the invention depicting a semiconductor chip package assembly.
Figure 6:
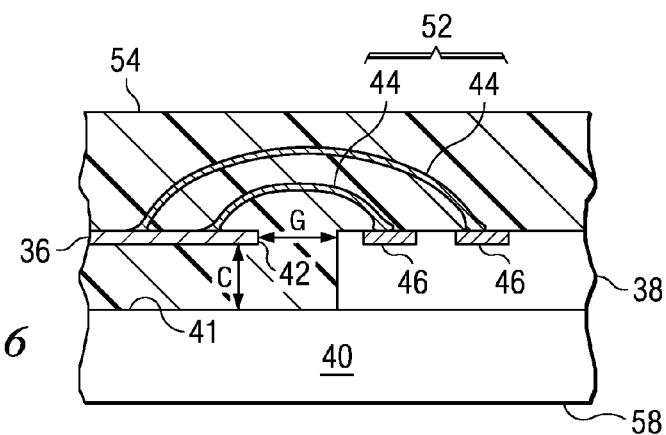
FIG. 6 is a detailed top view of a selected portion of the example of a preferred embodiment of the semiconductor chip package assembly illustrated in FIG. 5.

FIG. 5 is a top view of an example of a preferred embodiment of the invention depicting a semiconductor chip package assembly 51. As shown, the invention is advantageous in that multiple bondwires, e.g. 52, may be wirebonded to the proximal end 42 of a single leadfinger 36 without unacceptably reducing the clearance between the leadfinger 36 and the underlying surface of the heat spreader 40. The package assembly 51 is preferably encapsulated with curable dielectric mold compound 54 such as plastic or epoxy resin as known in the arts. Although variations are possible, the encapsulant 54 typically engulfs the chip 38, most of the leadframe 32, and the top surface 41 (as oriented in the drawings) and sides of the heat spreader 40, leaving exposed the distal ends 56 of the leadfingers 36, and bottom surface 58 of the heat spreader 40. Preferably the gap G between the proximal ends 42 of the leadfingers 36 and the chip 38 is as small as electrically practical, as it is generally desirable to minimize the length of the bondwires 44. FIG. 6 is a close-up view of a portion of the package 51 of FIG. 5 taken along line 6, providing an alternative view exemplifying the preferred arrangement having multiple 52 bondwires 44 attached to the proximal end 42 of a leadfinger 36 from bond pads 46 on the chip 38. The clearance C between the leadfinger 36 and heat spreader 40 is maintained within predetermined acceptable tolerances by the use of the heat block as described herein.

It should be appreciated that the invention provides a thinner package for a given heat spreader thickness and/or enables the use of a thicker heat spreader for a given package thickness. Additionally, the enhancements of the invention make possible a reduction of the gap between the chip and the proximal ends of the leadfingers. This, in some applications, may in turn enable the use of shorter bondwires, improving electrical performance, conserving precious metal wire, and reducing costs.

The methods and apparatus of the invention ensure adequate clearance between the proximal ends of leadfingers and adjacent heat spreaders, endowing leadframes and package assemblies with one or more useful advantages including but not limited to improved electrical properties, reduced thickness, improved thermal performance, increased durability, and reduced costs. While the invention has been described with reference to certain illustrative embodiments and particular advantages, those described herein are not intended to be construed in a limiting sense. For example, variations or combinations of steps or materials in the embodiments shown and described may be used in particular cases without departure from the invention. Various modifications and combinations of the illustrative embodiments as well as other advantages and embodiments of the invention will be apparent to persons skilled in the arts upon reference to the drawings, description, and claims.

We claim:

1. A method for assembling a semiconductor chip package comprising the steps of:
   providing a leadframe assembly, the leadframe assembly further comprising a metal leadframe, an attached heat spreader, and an attached semiconductor chip having bond pads, wherein the leadframe further comprises a plurality of leadfingers, each leadfinger having a proximal end for receiving one or more wirebond, the proximal ends of the leadfingers defining a plane parallel to a surface of the heat spreader, the leadfingers also having a distal end for electrical connection external to the package;
   while supporting the proximal ends of the leadfingers using a wirebonding cavity of a heat block, attaching a plurality of bondwires coupling a plurality of bond pads of the semiconductor chip to a plurality of proximal ends of leadfingers; and thereafter,
   using a spacing cavity of the heat block, adjusting the clearance between the wirebonded proximal ends of the leadfingers and the surface of the heat spreader.

2. The method according to claim 1 further comprising steps for encapsulating the chip, bondwires, proximal ends of the leadfingers, and parallel surface of the heat spreader within dielectric mold compound.

3. The method according to claim 1 further comprising steps for:
   while supporting the proximal ends of the leadfingers using a wirebonding cavity of a heat block, attaching a plurality of bondwires coupling a plurality of bond pads of the semiconductor chip to the proximal end of a single leadfinger.

4. The method according to claim 1 further comprising the step of applying a vacuum force within the wirebonding cavity during wirebonding in order to cause the surface of the heat spreader to support the proximal ends of the leadfingers.

5. The method according to claim 1 further comprising the step of applying a spring force within the wirebonding cavity during wirebonding in order to cause the surface of the heat spreader to support the proximal ends of the leadfingers.

6. The method according to claim 1 further comprising the step of applying a vacuum force within the spacing cavity in order to adjust the clearance between the surface of the heat spreader and the proximal ends of the leadfingers.

7. The method according to claim 1 further comprising the step of applying a spring force within the spacing cavity in order to adjust the clearance between the surface of the heat spreader and the proximal ends of the leadfingers.

8. A heat block for use in assembling a semiconductor chip package having a leadframe assembly, the heat block comprising:
   a rigid body having one or more wirebonding cavity adapted for supporting the leadframe assembly during wirebonding by holding the surface of a heat spreader of the leadframe assembly against the proximal ends of the leadfingers of the leadframe assembly; and
   a spacing cavity adapted for adjusting the clearance between the wirebonded proximal ends of the leadfingers and the surface of the heat spreader.

9. The heat block according to claim 8 wherein the wirebonding cavity comprises a depth adapted for forcing the surface of the heat spreader to make contact with the proximal ends of the leadfingers of an inserted leadframe assembly.

10. The heat block according to claim 8 wherein the spacing cavity comprises a depth selected for forcing the surface of the heat spreader away from the proximal ends of the leadfingers in order to adjust the clearance between them.

11. The heat block according to claim 8 wherein the spacing cavity comprises a depth selected for forcing the proximal ends of the leadfingers away from the surface of the heat spreader in order to adjust the clearance between them.

12. The heat block according to claim 8 further comprising a vacuum port for communicating a vacuum force to the wirebonding cavity during wirebonding in order to force the surface of the heat spreader against the proximal ends of the leadfingers.

13. The heat block according to claim 8 further comprising a vacuum port for communicating a vacuum force to the spacing cavity in order to force the surface of a heat spreader supported in the spacing cavity away from the proximal ends of the leadfingers subsequent to wirebonding.

14. The heat block according to claim 8 further configured to transmit a mechanical force to a leadframe assembly supported in the wirebonding cavity during wirebonding in order to force the surface of the heat spreader against the proximal ends of the leadfingers.

15. The heat block according to claim 8 further configured to transmit a mechanical force for communicating a vacuum force to the spacing cavity in order to force the surface of the heat spreader away from the proximal ends of the leadfingers subsequent to wirebonding.

* * * * *